United States Patent [19]
Cowles

[11] Patent Number: 5,940,315
[45] Date of Patent: Aug. 17, 1999

[54] STRAPPED WORDLINE ARCHITECTURE FOR SEMICONDUCTOR MEMORY

[75] Inventor: Timothy B. Cowles, Boise, Id.

[73] Assignee: Micron Technology, Inc., Boise, Id.

[21] Appl. No.: 09/144,457

[22] Filed: Sep. 1, 1998

[51] Int. Cl.⁶ .............. G11C 5/02; G11C 5/06; G11C 8/00

[52] U.S. Cl. .......... 365/51; 365/63; 365/230.03; 365/230.06

[58] Field of Search .......... 365/51, 63, 230.03, 365/230.06

[56] References Cited

U.S. PATENT DOCUMENTS

| | | | |
|---|---|---|---|
| 5,251,168 | 10/1993 | Chung et al. | 365/51 |
| 5,631,864 | 5/1997 | Briner | 365/185.05 |
| 5,644,526 | 7/1997 | Mazzali | 365/51 |
| 5,706,245 | 1/1998 | Kim | 365/230.06 |
| 5,708,620 | 1/1998 | Jeong | 365/230.06 |
| 5,708,621 | 1/1998 | Tanoi | 365/230.06 |
| 5,724,291 | 3/1998 | Matano | 365/230.06 |
| 5,768,174 | 6/1998 | Seo et al. | 365/63 |

*Primary Examiner*—Trong Phan
*Attorney, Agent, or Firm*—Dickstein Shapiro Morin & Oshinsky LLP

[57] ABSTRACT

Disclosed is a method and apparatus for connecting the wordlines of memory arrays to respective row decoders in a manner which reduces the physical space required for implementing a memory device. The wordlines of a first memory array are connected directly to an adjacent row decoder. Metal straps, which connect across every other wordline of the first memory array, are used to connect the row decoder to the wordlines of another memory array not adjacent to the row decoder. By utilizing the same row decoders for multiple arrays via the metal straps, the number of row decoders required for a memory bank can be reduced, thereby reducing the overall physical space necessary for implementation of the memory device. The use of metal for the straps provides minimal effect on the access timing of the wordlines connected to the row decoders via the metal straps, and the strapping of only every other wordline of each array provides sufficient space between the straps to prevent them from shorting together.

69 Claims, 4 Drawing Sheets

STRAPPED WORDLINE ARCHITECTURE FOR SEMICONDUCTOR MEMORY

BACKGROUND OF THE INVENTION

1. Field of the Invention

The present invention relates to semiconductor memory devices, and more particularly to a semiconductor memory device with an alternative strapped wordline architecture and to a method for its fabrication.

2. Description of the Related Art

Semiconductor devices are widely used in various types of electronic products, consumer products, printed circuit cards, and the like. In an integrated circuit, a number of active semiconductor devices are formed on a chip ("die") of silicon and the chip circuit is interconnected to packages leads to form a complete circuit. In the design of Very Large Scale Integrated (VLSI) circuits, dynamic logic cells which are maintained in integrated circuits in a space efficient manner and which improve the speed of read operations by making array row and column selection faster is a goal sought by designers. The improvement in the speed of read and write operations for dynamic logic cells utilized in memory designs reduces delays in processing which, in turn, increases performance of the overall system. Additionally, any reduction in the size of the package can provide a significant commercial advantage.

Semiconductor memory devices such as a random access memories (RAM) comprise an array of individual memory cells. A RAM allows the user to both read information from the memory and to write new information into the memory. Data is read from the memory by activating a row, referred to as a wordline, which couples all memory cells corresponding to that row to active digit or bit lines which define the columns of the array. When a particular wordline is activated, sense amplifiers connected to an active bit line detect and amplify the data by measuring the potential difference between the activated bit line and a reference.

Figure 1:
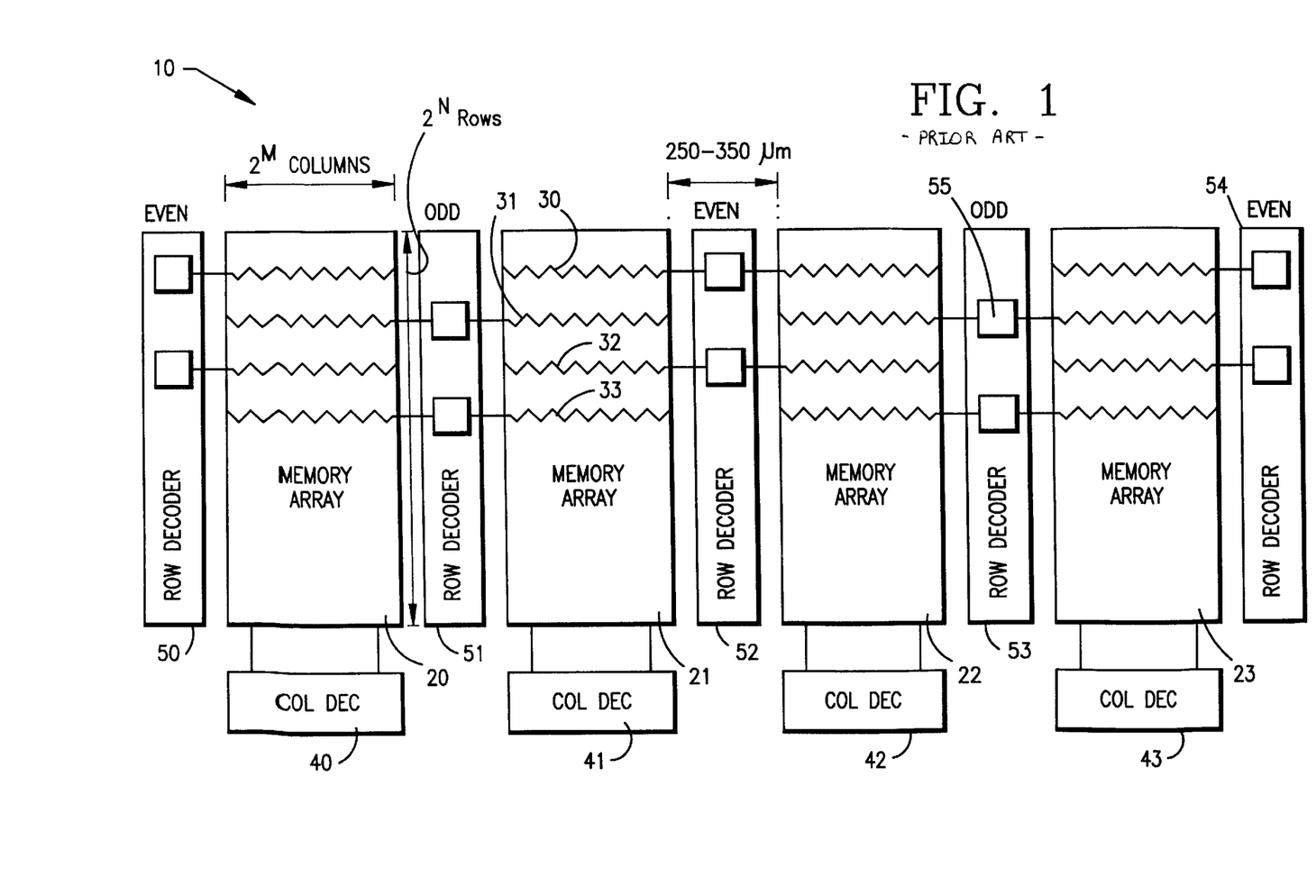
FIG. 1 illustrates a block diagram of a conventional memory bank architecture.

FIG. 1 illustrates a block diagram of a typical memory bank architecture. Memory bank 10 consists of parallel memory arrays 20, 21, 22, 23. Each of the memory arrays 20–23 comprises a plurality of memory cells (not shown), arranged in $2^M$ columns by $2^N$ rows. Each of the memory cells located in the same row of the array are coupled together by a wordline, as illustrated by wordlines 30, 31, 32, 33. Each of the wordlines 30–33 of the respective arrays 20–23 are connected to a respective row decoder 50, 51, 52, 53, 54. Each of row decoders 50–54 contains row driver circuitry 55, which activates the desired wordline 30–33 of the respective array 20–23 of the cell desired to be accessed. Row decoders 50, 52 and 54 are designated as even row decoders, and row decoders 51 and 53 are designated as odd row decoders. A respective column decoder 40, 41, 42, 43 is provided for each array 20–23 to access the particular column or columns desired.

In order to maintain a consistent time constant associated with accessing any of the cells in the arrays, a row decoder is provided adjacent to each side of each memory array and the wordlines of each respective array are connected to a row decoder located directly adjacent to each array. This minimizes the delays in signal propagation through each wordline since the row decoders are evenly distributed throughout the array.

Thus, as shown in FIG. 1, the even wordlines of each array are connected to the closest adjacent even row decoder, while the odd wordlines of an array are connected to the closest adjacent odd row decoder. For example, even wordline 30 of array 21 is connected to even row decoder 52, odd wordline 31 of array 21 is connected to odd row decoder 51, even wordline 32 is connected to even row decoder 52, odd wordline 33 is connected to odd row decoder 51, etc. This requires an odd row decoder and an even row decoder to be positioned directly adjacent to each side of each of the arrays. A typical row decoder gap requires approximately 250 µbetween each array, with some row decoders requiring up to 350 µbetween each array. Thus, the amount of space required only by the row decoders could be as much as 1,750 µm for each memory bank that consists of four arrays as illustrated by memory bank 10.

This space significantly increases the overall physical space required by a memory device which consists of several memory banks 10 as depicted in FIG. 1.

Additionally, the number of row decoders of the conventional memory bank could not be decreased by connecting wordlines of one array to a row decoder through the wordline of another array. For example, if wordline 30 of array 21 was connected to row decoder 50 through wordline 30 of array 20, thus eliminating the need for row decoder 52, the propagation delay associated with the polysilicon used for each wordline would cause delays in accessing the cells located in wordline 30 of array 21. The delay associated with the propagation of a signal through both wordlines 30 of arrays 21 and 20 may be significant enough to affect the speed of the memory bank 10, rendering the memory bank 10 unusable in high speed end systems.

Thus, there exists a need for an alternative memory architecture that reduces the amount of space necessary for the row decoders while also maintaining the system time constant associated with accessing any cell in the entire bank. Additionally, sufficient space must be provided between the wordlines, or any other connections to the row decoders, to prevent them from shorting together, rendering the memory bank defective.

SUMMARY OF THE INVENTION

The present invention advantageously provides a unique method and apparatus for reducing the amount of space in a memory device occupied by row decoders while maintaining the time constant associated with accessing the cells of the arrays.

In accordance with a preferred embodiment, every other row decoder block in the FIG. 1 architecture is eliminated by providing a conductive communication path such as a metal layer strap across every other wordline in each array for connection to a remaining row decoder block. The elimination of every other row decoder block will reduce the overall space occupied by the memory bank, while the strapping across every other wordline maintains sufficient spacing to prevent shorting of the straps together. Additionally, the strapping across the wordlines maintains the timing of accessing of the cells of the arrays of the memory bank.

These and other advantages and features of the invention will become apparent from the following detailed description of the invention which is provided in connection with the accompanying drawings.

DETAILED DESCRIPTION OF THE PREFERRED EMBODIMENTS

The present invention will be described with reference to the preferred embodiments illustrated in FIGS. 2–3. Other embodiments may be utilized and structural or logical changes may be made without departing from the scope of the present invention.

Figure 2A:
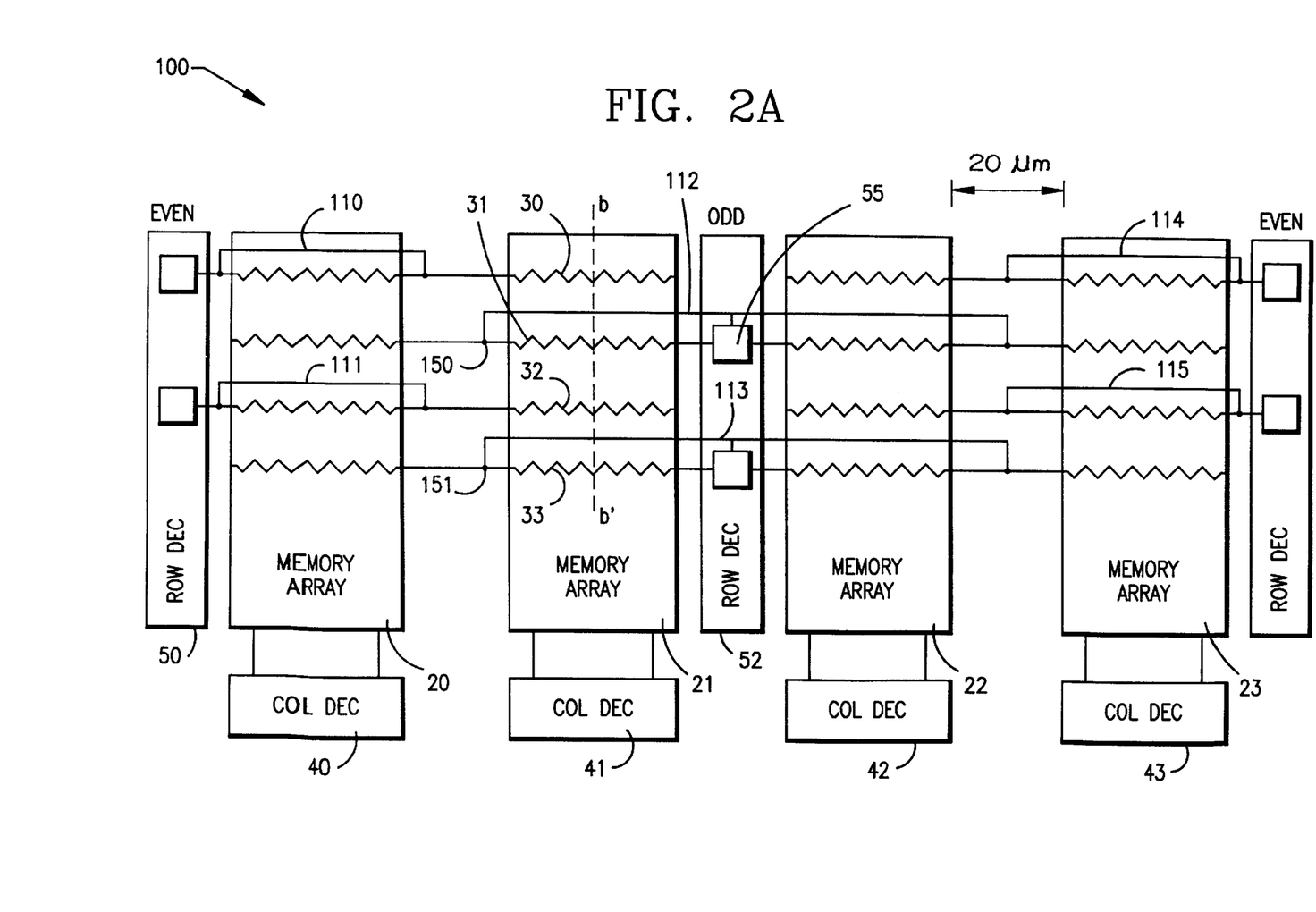
FIG. 2A illustrates a block diagram of a memory bank configured in accordance with the present invention.

FIG. 2A illustrates in block diagram form a semiconductor memory bank 100 with an architecture in accordance with the present invention. Memory bank 100 has similar components as described with respect to memory bank 10 of FIG. 1. Components of memory bank 100 that are identical to components of memory bank 10 of FIG. 1 are given like numeric identifiers. Memory bank 100 may be provided as part of an integrated circuit.

Memory bank 100 consists of parallel memory arrays 20, 21, 22, 23. While four arrays are shown in memory bank 100, the invention is not limited to a specific number of arrays, and may be used with any number of arrays greater than one. Each of the memory arrays 20–23 comprises a plurality of memory cells (not shown), arranged in $2^M$ columns by $2^N$ rows. Each of the memory cells located in the same row of the array are coupled together by a wordline, as illustrated by wordlines 30, 31, 32, 33. For clarity, not all wordlines of each array are shown. A respective column decoder 40, 41, 42, 43 is provided for each array 20–23 to access the particular column desired.

In accordance with the present invention, only three row decoders 50, 52 and 54 are provided. Each of row decoders 50, 52, 54 contains row driver circuitry 55, which activates the desired wordline 30–33 of the respective array 20–23 of the cell desired to be accessed. Row decoders 50 and 54 are designated as even row decoders, and row decoder 52 is designated as an odd row decoder. Row decoder 50 is positioned adjacent to memory array 20 on the opposite side of memory array 21, row decoder 52 is positioned between memory array 21 and memory array 22, and row decoder 54 is positioned adjacent to memory array 23 on the opposite side of memory array 22 as shown. Each of the wordlines 30–33 of the respective arrays 20–23 are connected to one of the respective row decoders 50, 52, or 54.

In order to compensate for the reduced number of row decoders provided in the memory bank 100, straps 110, 111, 112, 113, 114, and 115, formed of a conductive metal, are added to the memory bank 100 to connect the wordlines 30–33 of the arrays 20–23 to one of the row decoders 50, 52, 54. The conductive metal straps are provided during the fabrication process of the memory bank utilizing a metal layer located above the poly layers on the semiconductor chip. While the straps 110–115 are illustrated as spanning the entire respective memory array, the invention is not so limited and straps 110–115 may span any portion of the respective memory arrays.

Figure 2B:
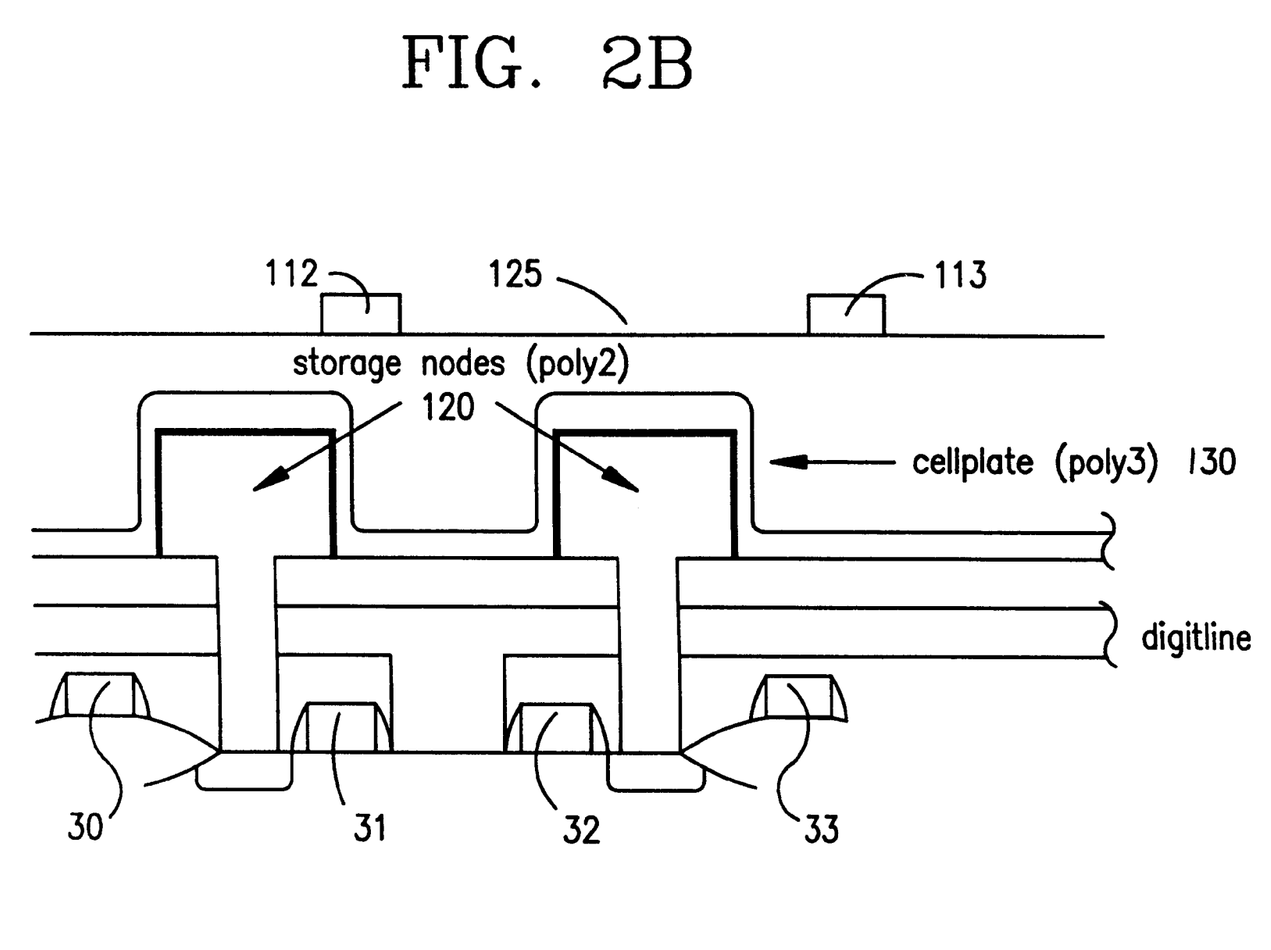
FIG. 2B illustrates a cross sectional diagram of a memory array configured in accordance with the present invention.

FIG. 2B illustrates a cross sectional diagram of a portion of array 21 of FIG. 2A across the line segment bb'. Straps 112 and 113 are formed in line with wordlines 31 and 33 in a metal layer above the storage node poly later 120 (poly2) and the cell plate poly layer 130 (poly3). By only strapping across every other wordline, in this case wordlines 31 and 33, there is a sufficient space 125 maintained between the straps 112, 113 to prevent them from shorting together. Straps 112, 113 are connected to wordlines 31, 33 respectively outside the edge of array 21 as shown in FIG. 2A at nodes 150, 151 through a contact hole in the poly layers. While a real metal, such as but not limited to aluminum, tungsten, titanium, or molybdenum is preferable for the composition of the straps, any material that has a lower resistivity than that of the polysilicon wordlines may be used. The resistivity of the straps must be less than that of the polysilicon used for the wordlines to maintain minimal delay in accessing the cells via the straps.

Thus, for example, even wordline rows 30 and 32 of array 20 are connected directly to even row decoder 50. Even wordline rows 30 and 32 of array 21 are connected to even row decoder 50 via metal straps 110 and 111 respectively. Each of straps 110 and 111 bridges the corresponding wordline row of array 20, i.e., the strap provides an alternate path of lesser resistance for a signal from one side of the wordline to the other.

Similarly, even wordline rows 30 and 32 of array 23 are connected directly to even row decoder 54. Even wordline rows 30 and 32 of array 22 are connected to even row decoder 50 via metal straps 114 and 115 respectively. Each of straps 114 and 115 bridges the corresponding wordline row of array 23.

Odd wordline rows 31 and 33 of arrays 21 and 22 are connected directly to odd row decoder 52. Odd wordline rows 31 and 33 of arrays 20 and 23 are connected to odd row decoder 52 via metal straps 112 and 113 respectively. Each of the metal straps 112, 113 bridges the corresponding wordline row of arrays 21 and 22.

By utilizing the metal straps 110–115 on every other wordline of an array in accordance with the present invention, every other row decoder gap can be eliminated. For example, the resulting space required between any two arrays without a row decoder between them may be approximately 20 μm. Thus, the gap size required may be significantly reduced from 250–350 μm that may be found in the conventional FIG. 1 architecture to approximately 20 μm for each gap where a row decoder is eliminated.

Additionally, the timing of the system will not be adversely impacted since the use of metal for the straps does not significantly add to the propagation delay of the cells accessed via the straps when compared with the conventional architecture described with respect to FIG. 1. Furthermore, since the strapping is done on only every other wordline of each array, sufficient spacing between each strap of the same array is maintained to prevent shorting of the straps (and connected wordlines) to each other.

Figure 3:
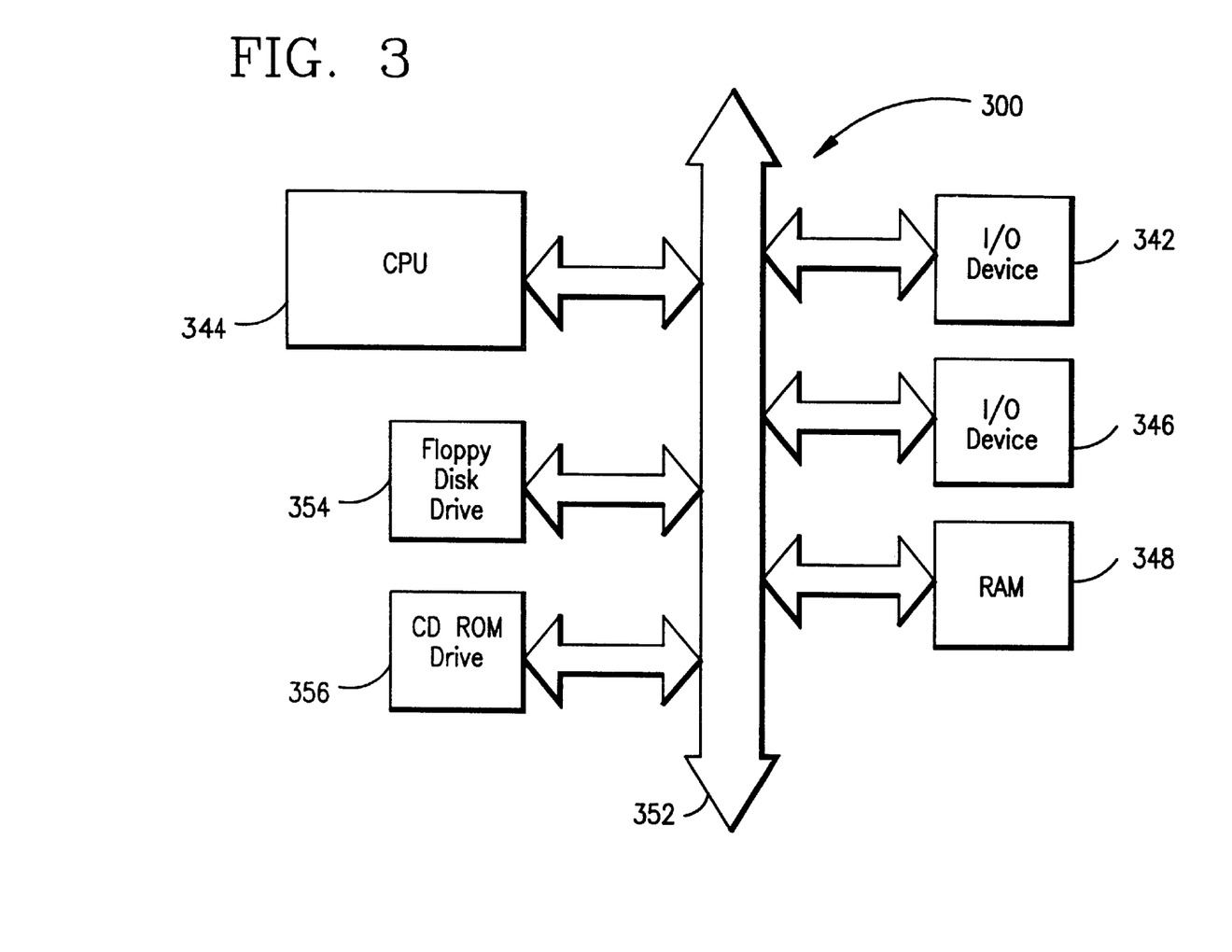
FIG. 3 illustrates a block diagram of a computer system implementing the present invention.

A typical processor system which includes a memory device according to the present invention is illustrated generally at 300 in FIG. 3. A computer system is exemplary of a device having digital circuits which include memory devices. Other types of dedicated processing systems, e.g. radio systems, television systems, GPS receiver systems, telephones and telephone systems also contain memory devices which can utilize the present invention.

A processor system, such as a computer system, generally comprises a central processing unit (CPU) 344 that communicates with an input/output (I/O) device 342 over a bus 352. A second I/O device 346 is illustrated, but may not be necessary depending upon the system requirements. The computer system 300 also includes random access memory (RAM) 348 and may include peripheral devices such as a floppy disk drive 354 and a compact disk (CD) ROM drive 356 which also communicate with CPU 344 over the bus 352.

Utilizing the method of the present invention, the space occupied by the memory circuits can be reduced, thus reducing the size of the overall system. It must be noted that the exact architecture of the computer system 300 is not important and that any combination of computer compatible devices may be incorporated into the system.

Reference has been made to a preferred embodiment in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A memory device comprising:
   a plurality of parallel memory arrays, each of said plurality of parallel memory arrays including a plurality of memory cells arranged in rows and columns, each of said memory cells in a respective row of a respective one of said plurality of parallel memory arrays being connected by a respective one of a plurality of wordlines;
   a plurality of row decoders, each of said plurality of wordlines being connected to a respective one of said plurality of row decoders for accessing said memory cells in a row; and
   at least one conductive strap, said conductive strap being formed of a material with a lower resistivity than a material used to form said wordlines, said conductive strap being used to connect at least one of said plurality of wordlines of at least one of said plurality of memory arrays to a row decoder, said at least one conductive strap being connected across at least one of said plurality of wordlines of another of said plurality of memory arrays connected to said row decoder.

2. The memory device according to claim 1, wherein said at least one conductive strap is connected across every other wordline of said another of said plurality of memory arrays.

3. The memory device according to claim 1, wherein said conductive strap is formed of metal.

4. The memory device according to claim 3, wherein said metal is a metal layer formed during a fabrication process of said memory device.

5. A memory device comprising:
   a plurality of parallel memory arrays, each of said plurality of parallel memory arrays including a plurality of memory cells arranged in rows and columns, each of said memory cells in a respective row of a respective one of said plurality of parallel memory arrays being connected by a respective one of a plurality of wordlines;
   a row decoder, said row decoder being positioned between a first of said plurality of memory arrays and a second of said plurality of memory arrays, said first and second memory arrays being connected directly to said row decoder; and
   at least one conductive strap formed of a material with a lower resistivity than a material used to form said plurality of worldines,
   wherein said at least one conductive strap is used to connect at least one of said plurality of wordlines of at least one of said plurality of memory arrays located adjacent to said first or said second memory, arrays to said row decoder by connecting across at least one of said plurality of wordlines of said first or said second memory arrays.

6. The memory device according to claim 5, wherein said at least one conductive strap is formed of metal.

7. The memory device according to claim 6, wherein said metal is a metal layer formed during a fabrication process of said memory device.

8. A semiconductor memory device comprising:
   at least one memory bank, said at least one memory bank comprising:
      a first memory array, a second memory array, a third memory array, and a fourth memory array, each of said memory arrays being parallel to one another, each of said memory arrays including a plurality of memory cells arranged in rows and columns, each of said memory cells in a respective row of a respective one of said arrays being connected by a respective one of a plurality of wordlines, each of said plurality of wordlines belonging to a first set of wordlines or a second set of wordlines, said wordlines of said first set alternating with said wordlines of said second set;
      a first row decoder, a second row decoder, and a third row decoder; and
      at least one conductive strap formed of a material with a lower resistivity than a material used to form said wordlines, said at least one conductive strap being used to connect one or more of said plurality of wordlines of said first, second, third, or fourth memory arrays to one of said first, second or third row decoders, said conductive strap being connected across at least one of said plurality of wordlines of another of said first, second, third or fourth memory arrays.

9. The semiconductor memory device according to claim 8, wherein said first row decoder is positioned adjacent to said first memory array on a side opposite said second memory array.

10. The semiconductor device according to claim 9, wherein said second row decoder is positioned between said second memory array and said third memory array.

11. The semiconductor device according to claim 10, wherein said third row decoder is positioned adjacent to said fourth memory array on a side opposite said third memory array.

12. The semiconductor memory device according to claim 11, wherein said first set of wordlines of said first memory array are connected to said first row decoder, and said first set of wordlines of said second memory array are connected to said first row decoder by said at least one conductive strap.

13. The semiconductor device according to claim 12, wherein said at least one conductive strap is connected across at least one wordline of said first set of wordlines of said first memory array.

14. The semiconductor memory device according to claim 13, wherein said first set of wordlines of said fourth memory array are connected to said third row decoder, and said first set of wordlines of said third memory array are connected to said third row decoder by said at least one conductive strap.

15. The semiconductor device according to claim 14, wherein said at least one conductive strap is connected across at least one wordline of said first set of wordlines of said fourth memory array.

16. The semiconductor memory device according to claim 10 wherein said second set of wordlines of said second and third memory arrays are connected to said second row decoder, and said second set of wordlines of said first and fourth memory arrays are connected to said second row decoder by said at least one conductive strap.

17. The semiconductor device according to claim 16, wherein said at least one conductive strap is connected across at least one wordline of said second set of wordlines of said second and said third memory arrays.

18. An integrated circuit comprising:
 a memory device comprising:
  at least one memory bank, said at least one memory bank including a plurality of parallel memory arrays, each of said plurality of parallel memory arrays including a plurality of memory cells arranged in rows and columns, each of said memory cells in a respective row of a respective one of said plurality of parallel memory arrays being connected by a respective one of a plurality of wordlines;
  a plurality of row decoders, each of said plurality of wordlines being connected to a respective one of said plurality of row decoders for accessing said memory cells in a row; and
  at least one conductive strap formed of a material with a lower resistivity than a material used to form said wordlines, said conductive strap being used to connect at least one of said plurality of wordlines of a memory array to a row decoder by connecting across a wordline of another of said plurality of memory arrays connected directly to said row decoder.

19. The integrated circuit according to claim 18, wherein said conductive strap is formed of metal.

20. The integrated circuit according to claim 19, wherein said metal is a metal layer formed during a fabrication process of said memory device.

21. The integrated circuit according to claim 18, wherein said plurality of memory arrays includes a first memory array, a second memory array, a third memory array, and a fourth memory array, each of said memory arrays being parallel to one another.

22. The integrated circuit according to claim 21, wherein each of said plurality of wordlines belongs to either a first set of wordlines or a second set of wordlines, said wordlines of said first set alternating with said wordlines of said second set.

23. The integrated circuit according to claim 22, wherein said plurality of row decoders comprises:
 a first row decoder, a second row decoder, and a third row decoder.

24. The integrated circuit according to claim 23, wherein said first row decoder is positioned adjacent to said first memory array on a side opposite said second memory array.

25. The integrated circuit according to claim 24, wherein said second row decoder is positioned between said second memory array and said third memory array.

26. The integrated circuit according to claim 25, wherein said third row decoder is positioned adjacent to said fourth memory array on a side opposite said third memory array.

27. The integrated circuit according to claim 26, wherein said first set of wordlines of said first memory array are connected to said first row decoder, and said first set of wordlines of said second memory array are connected to said first row decoder by said at least one conductive strap.

28. The integrated circuit according to claim 27, wherein said at least one conductive strap is connected across at least one wordline of said first set of wordlines of said first memory array.

29. The integrated circuit according to claim 26, wherein said first set of wordlines of said fourth memory array are connected to said third row decoder, and said first set of wordlines of said third memory array are connected to said third row decoder by said at least one conductive strap.

30. The integrated circuit according to claim 29, wherein said at least one conductive strap is connected across at least one wordline of said first set of wordlines of said fourth memory array.

31. The integrated circuit according to claim 26, wherein said second set of wordlines of said second and third memory arrays are connected to said second row decoder, and said second set of wordlines of said first and fourth memory arrays are connected to said second row decoder by said at least one conductive strap.

32. The integrated circuit according to claim 31, wherein said at least one conductive strap is connected across at least one wordline of said second set of wordlines of said second and said third memory arrays.

33. A processor system comprising:
 a processing unit; and
 a memory device for storing data used by said processing system, said memory device comprising:
  at least one memory bank, said at least one memory bank including a plurality of parallel memory arrays, each of said plurality of parallel memory arrays including a plurality of memory cells arranged in rows and columns, each of said memory cells in a respective row of a respective one of said plurality of parallel memory arrays being connected by a respective one of a plurality of wordlines;
  a plurality of row decoders, each of said plurality of wordlines being connected to a respective one of said plurality of row decoders for accessing said memory cells in a row; and
  at least one conductive strap, said conductive strap being formed of a material with a lower resistivity than a material used to form said wordlines, said conductive strap being used to connect at least one of said plurality of wordlines of at least one of said plurality of memory arrays to a row decoder, said at least one conductive strap being conducted across at least one of said plurality of wordlines of another of said plurality of memory arrays connected to said row decoder.

34. The processor system according to claim 33, wherein said conductive strap is formed of metal.

35. The processor system according to claim 34, wherein said metal is a metal layer formed during a fabrication process of said memory device.

36. The processor system according to claim 33, wherein said plurality of memory arrays includes a first memory array, a second memory array, a third memory array, and a fourth memory array, each of said memory arrays being parallel to one another.

37. The processor system according to claim 36, wherein each of said plurality of wordlines belongs to either a first set of wordlines or a second set of wordlines, said wordlines of said first set alternating with said wordlines of said second set.

38. The processor system according to claim 37, wherein said plurality of row decoders comprises:
 a first row decoder, a second row decoder, and a third row decoder.

39. The processor system according to claim 38, wherein said first row decoder is positioned adjacent to said first memory array on a side opposite said second memory array.

40. The processor system according to claim 39, wherein said second row decoder is positioned between said second memory array and said third memory array.

41. The processor system according to claim 40, wherein said third row decoder is positioned adjacent to said fourth memory array on a side opposite said third memory array.

42. The processor system according to claim 41, wherein said first set of wordlines of said first memory array are connected to said first row decoder, and said first set of wordlines of said second memory array are connected to said first row decoder by said at least one conductive strap.

43. The processor system according to claim 42, wherein said at least one conductive strap is connected across at least one wordline of said first set of wordlines of said first memory array.

44. The processor system according to claim 41, wherein said first set of wordlines of said fourth memory array are connected to said third row decoder, and said first set of wordlines of said third memory array are connected to said third row decoder by said at least one conductive strap.

45. The processor system according to claim 44, wherein said at least one conductive strap is connected across at least one wordline of said first set of wordlines of said fourth memory array.

46. The processor system according to claim 41, wherein said second set of wordlines of said second and third memory arrays are connected to said second row decoder, and said second set of wordlines of said first and fourth memory arrays are connected to said second row decoder by said at least one conductive strap.

47. The processor system according to claim 46, wherein said at least one conductive strap is connected across at least one wordline of said second set of wordlines of said second and said third memory arrays.

48. A memory device comprising:
a plurality of parallel memory arrays, each of said plurality of parallel memory arrays including a plurality of memory cells arranged in rows and columns, each of said memory cells in a respective row of a respective one of said plurality of parallel memory arrays being coupled by a respective one of a plurality of row line sections;
at least one row decoder;
first row line section extending across a first array and coupled to said at least one row decoder;
a second row line section extending across a second array; and
a communication path between said second row line section and said at least one row decoder, said communication path at least in part in parallel with said first row line section.

49. The memory device according to claim 48, wherein said communication path is formed of metal.

50. The memory device according to claim 49, wherein said metal is a metal layer formed during a fabrication process of said memory device.

51. An integrated circuit comprising:
a memory device comprising:
a plurality of parallel memory arrays, each of said plurality of parallel memory arrays including a plurality of memory cells arranged in rows and columns, each of said memory cells in a respective row of a respective one of said plurality of parallel memory arrays being coupled by a respective one of a plurality of row line sections;
a row decoder;
a first row line section extending across a first array and coupled to said row decoder;
a second row line section extending across a second array; and
a communication path between said second row line section and said row decoder, said communication path at least in part in parallel with said first row line section.

52. The integrated circuit according to claim 51, wherein said communication path is formed of metal.

53. The integrated circuit according to claim 52, wherein said metal is a metal layer formed during a fabrication process of said memory device.

54. A memory device comprising:
a plurality of parallel memory arrays, each of said plurality of parallel memory arrays including a plurality of memory cells arranged in rows and columns;
a row decoder;
a first row line in a first array, said first row line coupled to said row decoder by a communication path;
a second row line in a second array, said second row line coupled to said row decoder, said second array placed physically between said row decoder and said first array,
wherein said communication path between said first row line and said row decoder is at least in part in parallel with said second row line.

55. The memory device according to claim 54, wherein said communication path is formed of metal.

56. The memory device according to claim 55, wherein said metal is a metal layer formed during a fabrication process of said memory device.

57. An integrated circuit comprising:
a memory device comprising:
a plurality of parallel memory arrays, each of said plurality of parallel memory arrays including a plurality of memory, cells arranged in rows and columns;
a row decoder;
a first row line in a first array, said first row line coupled to said row decoder by a communication path; and
a second row line in a second array, said second row line coupled to said row decoder, said second array placed physically between said row decoder and said first array,
wherein said communication path between said first row line and said row decoder is at least in part parallel with said second row line.

58. The integrated circuit according to claim 57, wherein said communication path is formed of metal.

59. The integrated circuit according to claim 58, wherein said metal is a metal layer formed during a fabrication process of said memory device.

60. A method for connecting a wordline of a memory array to a row decoder of a memory device, said memory device comprising a plurality of parallel memory arrays, each of said memory arrays including a plurality of wordlines, said method comprising the steps of:
connecting at least one of said wordlines of one of said plurality of memory arrays directly to a row decoder; and
connecting at least one of said wordlines of another of said plurality of memory arrays to said row decoder via at least one conductive strap,
said at least one conductive strap being formed of a material with a lower resistivity than a material used to form said wordlines, said at least one conductive strap being connected across said at least one of said wordlines of said one of said plurality of memory arrays.

61. The method according to claim 60, wherein said at least one conductive strap is formed of a metal.

62. The method according to claim 61, wherein said at least one conductive strap is formed during a fabrication process of said memory device.

63. The method according to claim 60, wherein said memory device comprises a first memory array, a second memory array, a third memory array, and a fourth memory array, each of said memory arrays being parallel to one another, and a first row decoder, a second row decoder, and a third row decoder, said method further comprising:

positioning said first row decoder adjacent to said first memory array on a side opposite said second memory array;

positioning said second row decoder between said second memory array and said third memory array; and positioning said third row decoder adjacent to said fourth memory array on a side opposite said third memory array.

64. The method according to claim 63, wherein said each of said wordlines of said first, second, third and fourth memory arrays belongs to either a first set of wordlines or a second set of wordlines, said wordlines of said first set alternating with said wordlines of said second set, said method further comprising the steps of:

connecting said first set of wordlines of said first memory array to said first row decoder; and connecting said first set of wordlines of said second memory array to said first row decoder by said at least one conductive strap, said at least one conductive strap being connected across said at least one wordline of said first set of wordlines of said first memory array.

65. The method according to claim 64, further comprising the steps of:

connecting said first set of wordlines of said fourth memory array to said third row decoder; and connecting said first set of wordlines of said third memory array to said third row decoder by said at least one conductive strap, said at least one conductive strap being connected across said at least one wordline of said first set of wordlines of said fourth memory array.

66. The method according to claim 65, further comprising the steps of:

connecting said second set of wordlines of said second and said third memory arrays to said second row decoder; and connecting said second set of wordlines of said first and said fourth memory arrays to said second row decoder by said at least one conductive strap, said at least one conductive strap being connected across said at least one wordline of said second set of wordlines of said second and said third memory arrays.

67. A method for operating a memory device comprising a plurality of memory arrays and at least one row decoder, each of said plurality of memory arrays including a plurality of memory cells arranged in rows and columns, each of said memory cells in a respective row of a respective one of said plurality of memory arrays being connected by a respective one of a plurality of wordlines, said method comprising the steps of:

accessing at least one of said plurality of wordlines of at least one of said plurality of memory arrays by said at least one row decoder connected directly to said at least one of said plurality of wordlines; and accessing another one of said plurality of wordlines of another one of said plurality of memory arrays by said row decoder by a conductive strap connected between said another one of said plurality of memory arrays and said row decoder, said conductive strap being formed of a material with a lower resistivity than a material used to form said plurality of wordlines, said conductive strap being connected across at least one of said plurality wordlines of said at least one of said plurality of memory arrays.

68. The method according to claim 67, wherein said conductive strap is formed of a metal.

69. The method according to claim 68, wherein said conductive strap is formed during a fabrication process of said memory device.

* * * * *

UNITED STATES PATENT AND TRADEMARK OFFICE
CERTIFICATE OF CORRECTION

PATENT NO.    : 5,940,315

DATED         : August 17, 1999

INVENTOR(S)   : Timothy Cowles

It is certified that errors appear in the above-identified patent and that said Letters Patent is hereby corrected as shown below:

Column 2, line 10, replace "350 µbetween" with

--350 µm between--;

Column 3, line 64, replace "later" with --layer--.

In the Claims:

Claim 5, column 5, line 66, replace "memory, arrays" with

--memory arrays--.

Signed and Sealed this

Seventh Day of March, 2000

Attest:

Attesting Officer

Q. TODD DICKINSON

Commissioner of Patents and Trademarks